United States Patent [19]

Balyasny et al.

[11] Patent Number: 4,996,476
[45] Date of Patent: Feb. 26, 1991

[54] TEST CLIP FOR SURFACE MOUNT DEVICE

[75] Inventors: Marik Balyasny, Burbank; Kenneth B. Baldwin, Alta Loma, both of Calif.

[73] Assignee: ITT Corporation, New York, N.Y.

[21] Appl. No.: 432,093

[22] Filed: Nov. 6, 1989

[51] Int. Cl.⁵ .............. G01R 31/02; H01R 13/629; H01R 23/72

[52] U.S. Cl. ................ 324/158 F; 439/70; 439/264

[58] Field of Search ........... 324/158 F, 158 P, 72.5; 439/68, 70, 263, 264, 912

[56] References Cited

U.S. PATENT DOCUMENTS

| | | | |
|---|---|---|---|
| 3,573,617 | 4/1971 | Randolph et al. | 324/158 |
| 3,968,433 | 7/1976 | Dobarganes | 324/158 |
| 4,012,097 | 3/1977 | Long et al. | 339/45 |
| 4,176,895 | 12/1979 | Aldridge | 339/17 |
| 4,188,085 | 2/1980 | Aldridge et al. | 339/176 |
| 4,541,676 | 9/1985 | Hansen et al. | 339/17 |
| 4,645,279 | 2/1987 | Grabbe et al. | 439/70 |
| 4,671,590 | 6/1987 | Ignasiak | 439/266 |
| 4,671,592 | 6/1987 | Ignasiak et al. | 439/331 |
| 4,735,580 | 4/1988 | Hansen et al. | 439/264 |
| 4,750,890 | 6/1988 | Dube et al. | 439/152 |
| 4,797,118 | 1/1989 | Feamster | 439/264 |
| 4,816,751 | 3/1989 | Seiichi et al. | 324/73 |
| 4,833,404 | 5/1989 | Meyer et al. | 324/158 |

Primary Examiner—Ernest F. Karlsen
Attorney, Agent, or Firm—Thomas L. Peterson

[57] ABSTRACT

A test clip is provided which has multiple contacts that can engage the leads of a surface mount integrated circuit device whose leads are very closely spaced, while being reliably held down to the circuit device during a test procedure. The test clip has a housing with a recess (72, FIG. 10) that very closely recieves the top of the body of the circuit device (12) to align the clip with the circuit device, the clip being devoid of engagement with the lower part of the device. Instead, the test clip relies solely on frictional engagement of its contacts (24) with the circuit device leads (64) to hold down the test clip. Each contact has a first part (80) that initially lies against a contact-locating outer surface (82) of the housing. Each contact also has a second part (84) that extends below the contact-locating outer surface and that is positioned to be outwardly deflected slightly as it wipes across a circuit device lead, as the test clip is moved directly downwardly against the circuit device.

8 Claims, 5 Drawing Sheets

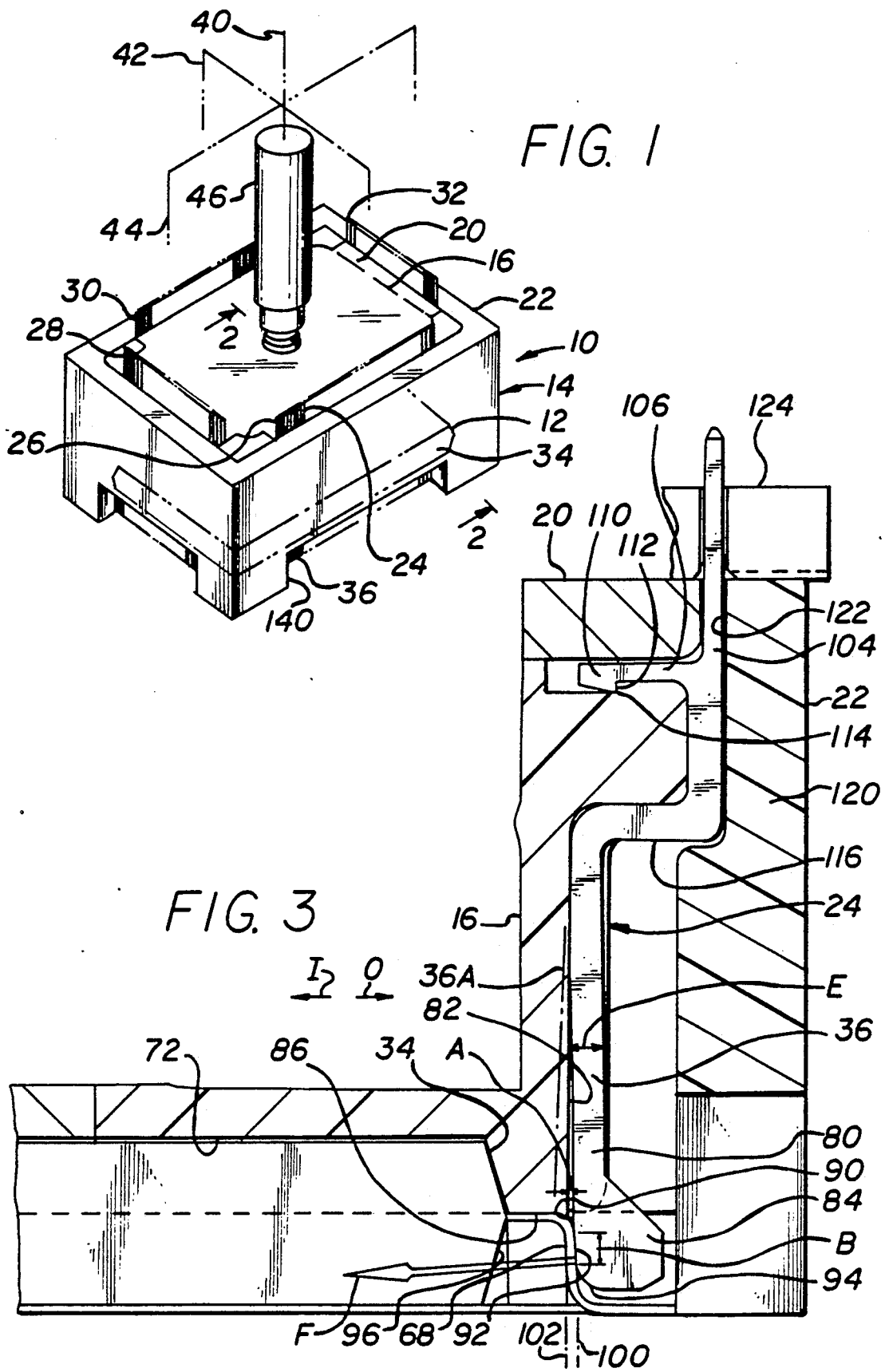

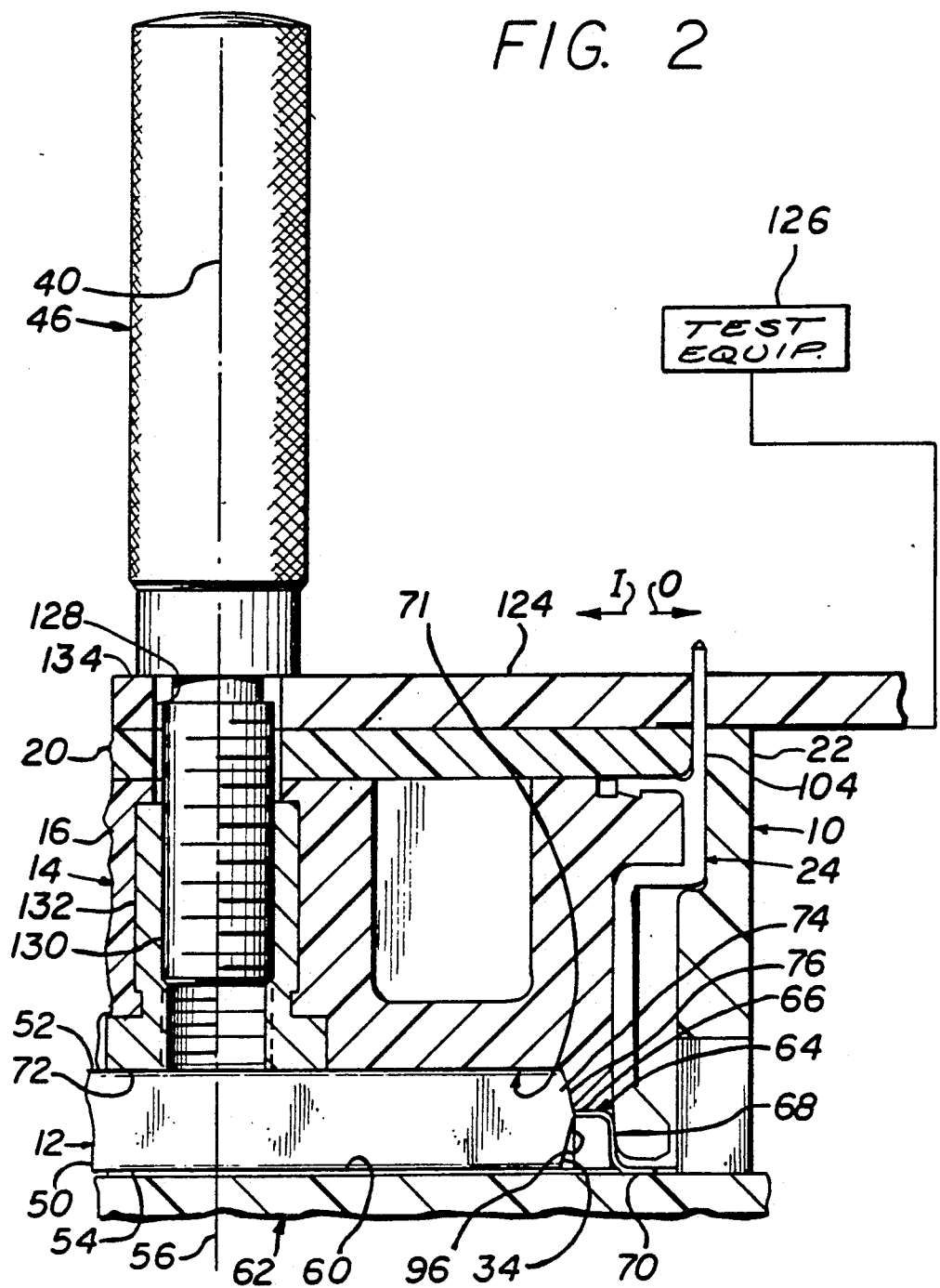

TEST CLIP FOR SURFACE MOUNT DEVICE

BACKGROUND OF THE INVENTION

Surface mount circuit devices generally have a plastic body that is of rectangular shape as seen in a top view, and multiple leads that extend from the sides of the body. With the body lying closely over a circuit board, the leads have largely horizontal upper parts extending outwardly from the body, largely vertical middle parts that extend down to the circuit board, and largely outwardly-extending lower parts that lie directly on conductive pads of the circuit board and which are soldered or otherwise attached thereto. Prior test clips have generally included a housing that bears against the top of the circuit device body and thin latches that fit between the leads and clamp against lower parts of the body to securely hold the test lead to the circuit device. After or during engagement of the latches with the body, the lower ends of test contacts are deflected by pivoting arms against the circuit device leads.

More recent circuit devices that include VLSI (very large scale integration) chips have large numbers of leads. The spacing or pitch of the leads is 25 mil (1 mil one thousandth inch) or less, resulting in a space of only 13 mil or less between leads. It is not practical to try to provide molded plastic barriers or latches of less than 13 mil thickness to pass between leads and engage the lower part of the device body. As a result, it can be difficult to provide a means for holding the test clip securely to the circuit device and to assure that the test clip contacts accurately engage corresponding leads of the circuit device. A test clip that could be securely held to a surface mount circuit device and whose contacts could be reliably engaged with the circuit device leads, in a relatively simple and low-cost construction, would be of considerable value.

SUMMARY OF THE INVENTION

In accordance with one embodiment of the present invention, a test clip is provided which has contacts that reliably engage corresponding leads of a surface mount circuit device and which is reliably held down to the circuit device during a test procedure. The test clip has a housing that closely receives the upper part of the circuit device body to closely locate the test clip thereon. The contacts of the test clip have first parts that are biased against contact-locating surfaces of the test clip housing, that lie slightly inward from the vertically-extending parts of the circuit device leads. The contacts have second parts that extend below the contact-locating outer surface and that are positioned to be outwardly deflected by a corresponding vertical lead part, to make wiping contact with the lead as the test clip is mounted on the circuit device. The test clip relies upon friction of its multiple contacts against the multiple leads of the circuit device to hold down the test clip to the circuit device during a test procedure.

Each contact of the test clip includes a substantially vertically-extending upper portion, and a primarily horizontal capture portion that has an enlargement. A test clip housing forms a recess that receives the contact capture portion. The walls of the recess form a shoulder that abuts the enlargement to prevent outward movement of the capture portion.

The novel features of the invention are set forth with particularity in the appended claims. The invention will be best understood from the following description when read in conjunction with the accompanying drawings.

BRIEF DESCRIPTION OF THE DRAWINGS

FIG. 1 is a perspective view of a test clip constructed in accordance with the present invention.

FIG. 2 is a partial sectional view taken on the line 2—2 of FIG. 1, and also showing a circuit board and a test circuit board apparatus of a system that includes the test clip.

FIG. 3 is an enlarged view of a portion of the system of FIG. 2.

DESCRIPTION OF A PREFERRED EMBODIMENT

Figure 4:
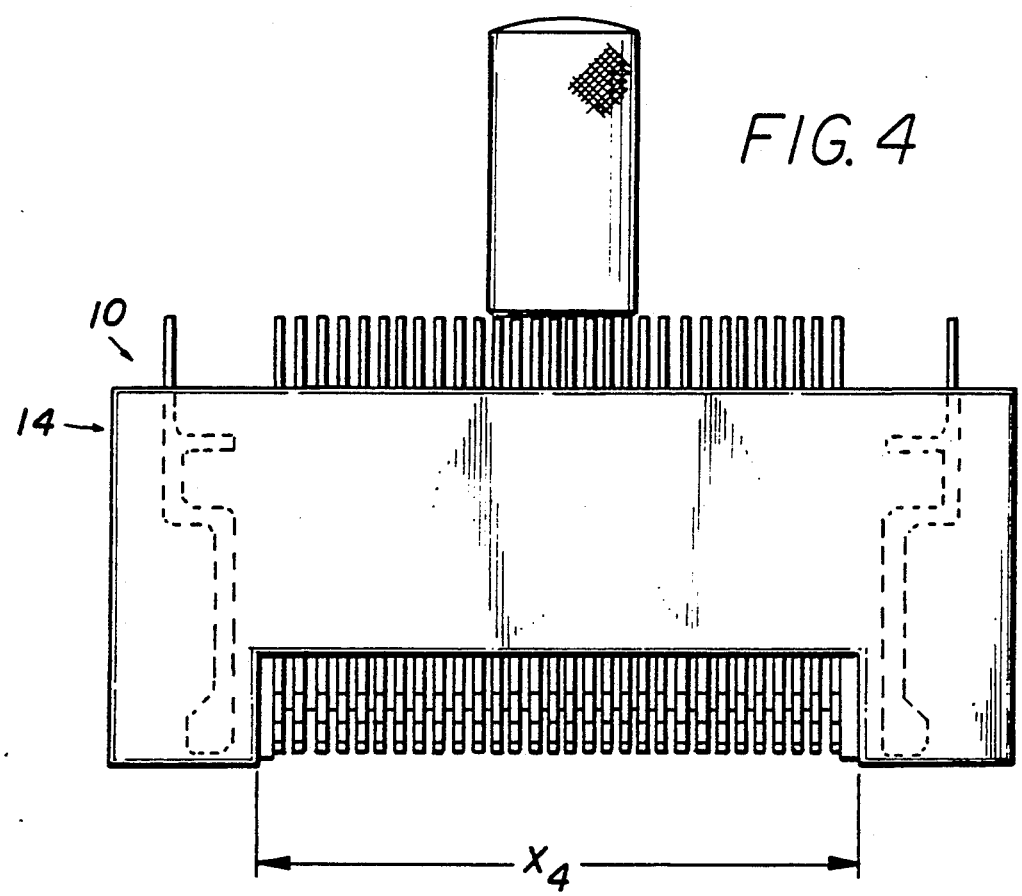
FIG. 4 is a side elevation view of the test clip of FIG. 1.

FIG. 1 illustrates a test clip 10 which can engage a surface mount integrated circuit device 12. The test clip has a housing 14 that includes a base 16, a cover 20 that mounts over the base, and a frame 22 that surrounds the base and cover. The test clip has numerous contacts 24 arranged in four rows 26, 28, 30, and 32 that extend along the four sides such as 34 of the circuit device. Each contact such as 24 has a lower portion 36 that can deflect inwardly and outwardly, in directions largely towards and away from an axis 40 of the test clip. Two imaginary planes, including a lateral plane 42 and longitudinal plane 44 extend in perpendicular directions through the clip axis 40. The lower portion 36 of each contact actually deflects towards and away from a corresponding plane, such as plane 44 for the particular contact lower portion shown at 36. A handle 46 is mounted along the clip axis, and allows a person to hold the test clip to carefully move it down against the circuit device 12 or to remove it. It should be noted that the terms vertical, top, bottom, and the like are used in this description only to describe the relative orientation of the parts as shown in the figures, and that the system can be used in various orientations.

As shown in FIGS. 2 and 3, the circuit device 12 has a body 50 with top and bottom parts 52, 54. A circuit device axis 56 extends vertically through the center of the body through its top and bottom parts. This circuit device lies substantially on the upper face 60 of a circuit board 62. The circuit device has a row of leads 64 extending from a side such as 34 of the body to the circuit board. Each lead includes a first or inner part 66 extending largely horizontally away from the body, a second outer lead part 68 extending primarily downwardly towards the circuit board, and a third part 70 that is coupled to a conductive pad (not shown) on the circuit board, with the third part of this circuit device extending along the surface of the board (it can instead lie in a hole).

The test clip includes a locating portion 71 with walls forming a recess 72 that is designed to closely receive an upper portion 74 of the circuit device body, which includes the top 52 and outwardly-downwardly sloping sides 76. The size of the circuit device body 50 is very precisely controlled, such as within 1/1000th inch. Applicant takes advantage of this, to assure that when the test clip receives the circuit device body, their relative locations are very closely controlled. The test clip recess has side walls 72 that very closely receive the sloping sides 76 of the circuit device body to locate the test clip both horizontally and vertically. There is generally a gap 77 over the top of the circuit device body.

As shown in FIG. 3, the lower portion 36 of each contact includes a first part 80 that is biased inwardly in the direction of arrow I. The lower part tends to assume the position 36A (in the absence of restraint). Before the circuit device body 50 is received, the first contact part 80 is biased against a contact-locating outer surface 82 of the housing, and specifically of the base 16 thereof. When the test clip is lowered against the circuit device, a second part 84 of the contact is deflected outwardly in the direction of arrow 0 by the second or outer lead part 68. The second contact part 84 extends below the lower end 86 of the contact-locating outer surface 82, but since it lies only a small distance below the lower end 86, the inward-outward position of the second contact part 84 is closely controlled. In detail, the second contact part has an inner surface or side 90 that wipes across an outer surface 92 of the outer lead part 68 as the test clip is lowered. At the beginning of engagement, a tapered bottom 94 of the contact second part encounters the lead and deflects the contact so it can wipe across the lead until it reaches its final position shown in FIG. 3.

Figure 6:
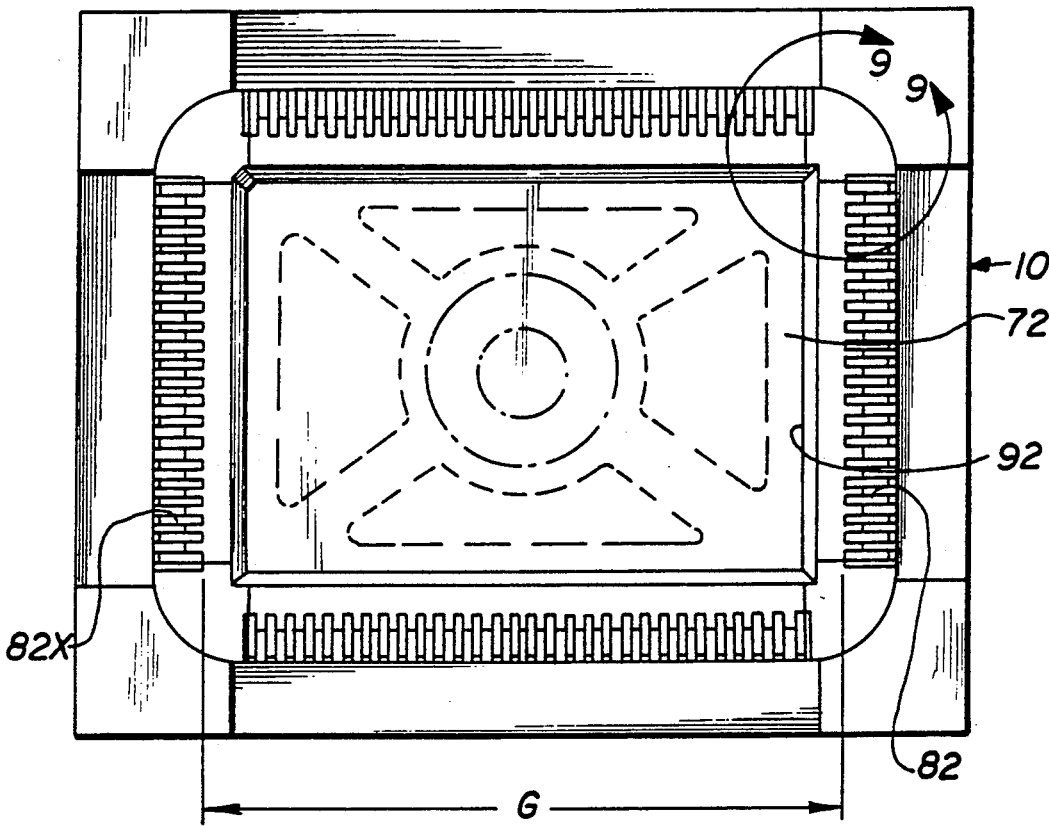
FIG. 6 is a bottom view of the test clip of FIG. 1.
Figure 7:
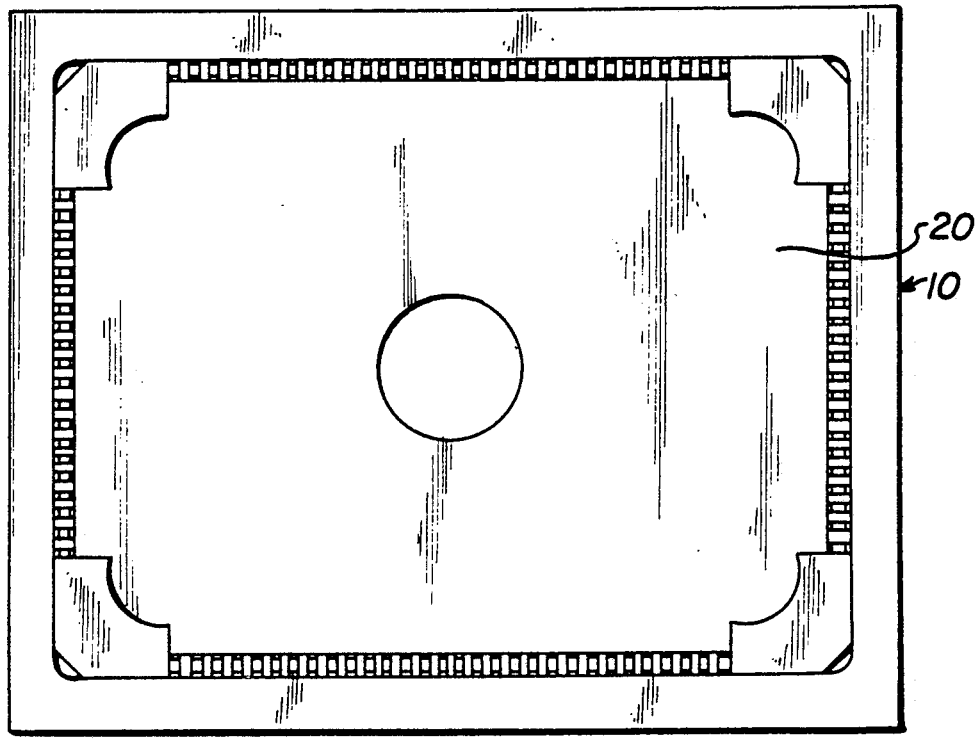
FIG. 7 is a plan view of the test clip of FIG. 1.

The contact-locating outer surface 82 of the housing is formed integrally with the walls of the recess 72 that closely locate the test clip with respect to the circuit device body. This results in the ability to maintain the surface 82 at a precise distance from the side 34 of the circuit device body. As a result, the lowest part of the contact at 84 has to be deflected only a small distance A of about 10 mil (one mil = 1/1000th inch) when it encounters a device lead. The small deflection which occurs over a vertical distance of engagement B of about 30 mil, allows applicant to achieve reliable deflection of the bottom of the contact as the test clip is lowered. The distance G (FIG. 6) between contact-locating outer surfaces 82, 82X at opposite sides of the housing is slightly less (about 20 mil less for the above example) than the distance between the outer surfaces of the outer lead parts 68 of the circuit device.

Figure 5:
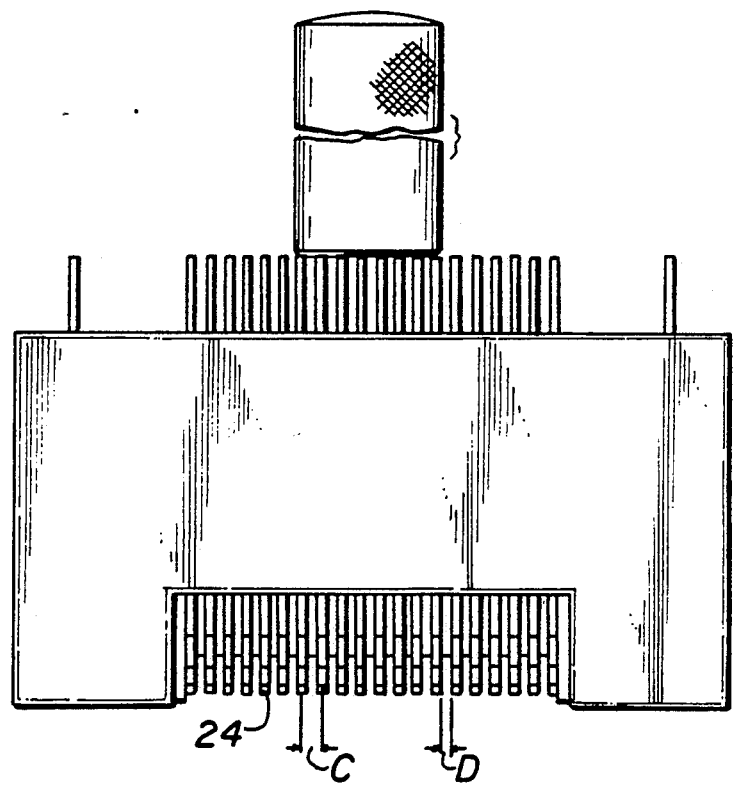
FIG. 5 is an end elevation view of the test clip of FIG. 1.

As shown in FIG. 5, the pitch size C of the contact 24 is very small, being 25 mil or less. Some circuit devices have a pitch as small as 10 and even 8 mil. The space D between adjacent contacts 24 is much less, being about 13 mil for contacts having a pitch size of 25 mil, and much less for smaller pitches. Prior test clips have used thin latches that pass between the bottoms of adjacent contacts to directly engage the body of the circuit device, to securely hold the test clip in place. There is great difficulty in providing very thin insulative latches and in mounting them precisely so that despite accumulated tolerances, the latches will fit in the narrow spaces between contacts that are very closely spaced. Applicant does not rely upon such direct contact of the test clip with the lower portion (96) of the circuit device body that lies below the locations at 86 where the leads extend primarily horizontally from the body. Instead applicant relies upon friction between test clip contacts and the circuit device leads to securely hold the test clip in place.

For contacts of the type shown in the figures, with a lower portion contact width E (FIG. 3) of 18 mil, contact thickness of about 12 mil, and height of the lower portion 36 of about 340 mil, a force F of about 55 grams can be expected. With a coefficient of friction of about 0.35, this leads to a frictional retention force of about 20 grams per contact. For test clips with between 100 and 160 contacts, the retention force is therefore between about 4 and 7 pounds. This is about the retention force desirable to assure that the test clip does not move until pulled up by a technician, while allowing the technician to easily remove the test clip without pulling off the circuit device.

The outer surfaces 92 of the leads extend primarily vertically, but at a relatively small angle of a few degrees from the vertical. Since there is a substantial coefficient of friction between the contacts and test leads, good frictional contact between them will be maintained even for an angle of the primarily vertical test lead part from the vertical of over 10 degrees. The outer surfaces 92 of a row of test leads lies in a outer lead first plane 100 that is primarily parallel to a second plane 102 that includes the contact-locating outer surface 82 of the housing. In the absence of the housing surface 82, the contacts would deflect to a position such as shown at 36A. This assures that the contact press against the housing surface 82 to closely locate their positions as they begin to mate with the circuit device leads. This assures that all contacts in a row will be deflected to press firmly against a corresponding lead.

Each contact includes a primarily vertically-extending upper portion 104 and a capture portion 106 that extends primarily horizontally and inwardly from the upper portion. The capture portion 104 has an enlargement 110 that forms an outwardly-facing shoulder 112. The shoulder abuts an abutment 114 on the base of the housing, that resists outward movement of the capture portion. The contact is installed on the base of the housing by pressing the contact inwardly so the capture portion 106 and a lower horizontal leg 116 lie respectively above and below a horizontally-projecting housing part 120 of the housing base. When the shoulder 112 snaps behind the abutment 114, the contact is temporarily held in position. The frame can be slipped around the base; the frame has an inner surface 122 that securely holds the upper part of the contact in the housing. The cover 20 can be pressed down into the base 16.

After the cover is installed, a test circuit board apparatus 124 is installed over the test clip, and the upper ends of the contacts are soldered to the test board apparatus. Conductive traces on the test board apparatus are connected to test equipment 126 that is used to test the circuit device. Finally the handle 46 is installed, by passing it down through a hole 128 in the test board apparatus, and screwing in a threaded lower end 130 of the handle into a threaded bushing 132. The handle is screwed down until a handle shoulder 134 presses against the upper face of the test circuit board apparatus 124, to thereby hold the circuit apparatus in place. The handle 46 extends by at least one half inch above the test clip and in this case by about one inch above it, to enable a person to grasp the handle to control installation and removal of the test clip.

It is useful to allow visual observation and physical inspection of the mating area where the contacts engage the leads. Applicant provides windows 140 (FIG. 1) at each side of the test clip to enable such observation. The fact that there are no latches and latches supports lying outward of the lower ends of the contacts, results in less obstructive viewing and access to the mating parts of the contacts and leads.

Figure 9:
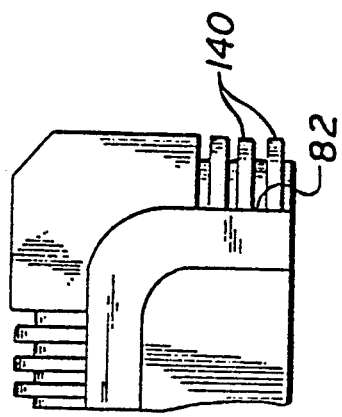
FIG. 9 is an enlarged view of an area 9—9 of FIG. 7.
Figure 10:
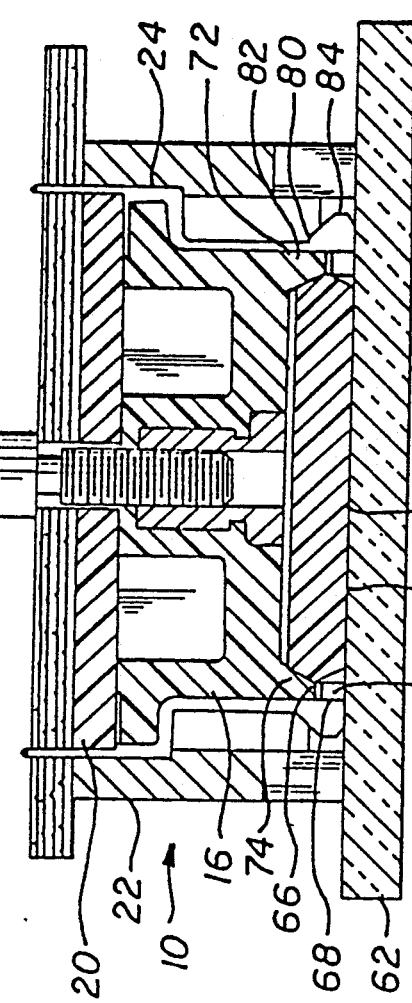
FIG. 10 is a sectional side view of the test clip of FIG. 1, and also showing the circuit board and test circuit board apparatus of FIG. 2.
Figure 8:
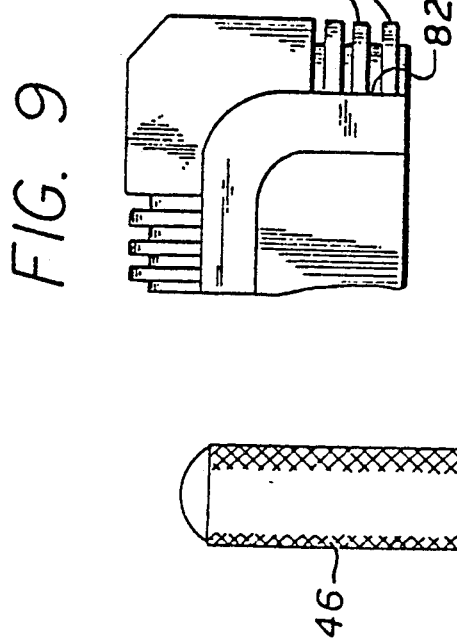
FIG. 8 is a sectional view of a portion of the housing of the test clip of FIG. 3.

FIGS. 8 and 9 show details of the base 16 of the housing, in the absence of the rest of the housing and in the absence of the contacts. The base has multiple barriers 141 that keep the contacts separated and that can be said to interrupt a contact-locating surface 82. The base (and frame) has four feet 142 that substantially lie on the circuit board about the body and the rows of leads of the circuit device.

Thus, the invention provides a test clip which can test a surface mount integrated circuit device that has multiple leads that are closely spaced from one another. This is accomplished by providing contacts on a test clip that initially bear against a contact-locating outer surface of the clip housing, that positions them so they are deflected a small distance by the leads as the test clip is installed. The test clip has a recess that closely engages an upper portion of the circuit device body to closely locate the contacts with respect to the leads as the test clip is installed. The test clip does not engage the circuit device body below the upper ends of the leads where they extend from the body to hold the test clip in place. Instead, the test clip is held in place substantially only by frictional engagement of the contacts with the leads.

Although particular embodiments of the invention have been described and illustrated herein, it is recognized that modifications and variations may readily occur to those skilled in the art, and consequently, it is intended that the claims be interpreted to cover such modifications and equivalents.

We claim:

1. A test clip which can test an integrated circuit device having a body with an upper portion of predetermined size, a bottom that can rest substantially on face of a circuit board, and a plurality of leads extending outwardly largely away from said body from each of a plurality of said body sides, and that each have an outer lead part extending primarily vertically downwardly toward the circuit board over which said body lies, with said downwardly-extending lead parts having outer surfaces, comprising:

a clip housing with recess walls forming a recess that closely receives the upper portion of said circuit device body to locate said housing both horizontally and vertically with respect to said device body, said housing having contact-locating outer surfaces that lie slightly inward of said outer surfaces of said leads; a plurality of contacts mounted on said clip housing and having lower portions that each includes a first contact part that is biased inwardly against one of said contact-locating outer surfaces and a second contact part that extends below the corresponding contact-locating outer surface and that is positioned to be outwardly deflected by a corresponding outer lead surface as the clip housing receives the upper portion of said device housing, with the inner side of the bottom of each contact second part being tapered so it is outwardly deflected by a corresponding outer lead part.

2. The test clip described in claim 1 wherein:
said clip housing includes a base forming said recess walls, said contact-locating outer surfaces, and an upper surface, and said clip housing includes a cover that fits over said base upper surface;
said contacts each have a substantially vertically-extending upper portion and a capture portion extending primarily horizontally from a location on said upper portion in an inward direction, said contact capture portion having an enlargement spaced from said upper portion;
said test clip housing forms a recess that receives said contact capture portion, and that includes a wall forming an abutment shoulder that abuts said enlargement to prevent outward movement of the capture portion;

3. The test clip described in claim 2 wherein:
said contacts each have a lower horizontal leg extending parallel to said capture portion;
said housing includes a horizontally-projecting housing part, and said contact horizontal leg and capture portion lie respectively against the bottom and top of said housing part, and said enlargement forms a downwardly-projecting shoulder that engages said abutment.

4. The test clip described in claim 1 wherein:
said test clip has a vertical test clip axis passing through its center; and including
a handle substantially centered on said clip axis, said handle having a lower end mounted to said housing and said handle extending above the top of said housing by a sufficient distance of at least one-half inch to allow grasping by the fingers of a person.

5. The test clip described in claim 1 wherein:
said test clip has a vertical test clip axis passing through its center; and including
a test circuit board apparatus for coupling to test equipment, said test board apparatus lying on said housing and having a plurality of holes and a plurality of conductors at said holes, said contacts having upper ends projecting through said test board apparatus holes and connected to said conductors, said board having a handle-passing hole centered on said test clip axis;
a handle substantially centered on said clip axis, and projecting through said handle-passing hole in said test board, said handle having a lower portion threadally coupled to said housing and an upper portion constructed to be grasped by a person, said handle upper portion having a shoulder at its bottom that abuts said test board apparatus to hold it down to said housing.

6. The test clip described in claim 1 wherein:
said test clip is devoid of parts that engage said device body below the locations where said leads extend from said body, with only the friction of said contacts against said leads holding said test clip down against said circuit device.

7. A test clip which can engage an integrated circuit device having a body with sides and an upper portion, and a row of leads at each of said sides, each lead having a substantially vertically extending outer part, comprising:
a clip housing having walls with inner surfaces that closely engage said body upper portion, said housing walls having outer surfaces that form contact-locating surfaces lying adjacent to said body opposite sides;
a plurality of contacts mounted on said clip housing, each contact having a lower portion with a first part biased inwardly against one of said contact-locating surfaces so that in the absence of said contact-locating surface, each contact would lie inward of said contact-locating surface, each contact having a second part lying below a corresponding contact-locating surface;

said lead outer parts having outer surfaces, and the contact-locating surfaces adjacent to said body opposite sides being spaced apart by a distance G which is slightly less than the distance between said lead outer surfaces, by an amount that allows said contact lower portions to deflect apart so said second parts thereof wipe against said lead outer surfaces as said clip is lowered against said circuit device.

8. A method for electrically connecting two opposite rows of contacts of a test clip to the multiple leads of an integrated circuit device that has a device body, a pair of opposite sides, and a pair of rows of said leads with each row having inner parts extending from one of said sides, wherein said leads have largely vertical outer lead parts, comprising:

constructing said test clip with walls that closely engage said device body and with opposite sides forming contact-locating surfaces that are spaced apart by slightly less than the distance between the outer lead parts at said opposite rows of leads, and establishing said rows of contacts so each contact has a first contact part biased against one of said contact-locating surfaces and a second contact part that extends below the corresponding contact-locating surface;

moving said test clip down against said device body so said locating portion closely engage said device body and said contact second parts wipe across said outer lead parts and are outwardly deflected to deflect said first contact parts slightly away from corresponding ones of said contact-locating surfaces;

leaving said test clip in place on said device and passing test currents between said contacts and leads while avoiding locking engagement of said test clip with any portion of said device body below the inner parts of said leads, whereby to hold the test clip down solely by friction of said contact against said leads.

* * * * *